(12) United States Patent
Cheng et al.

(10) Patent No.: US 10,446,650 B2
(45) Date of Patent: *Oct. 15, 2019

(54) FINFET WITH A SILICON GERMANIUM ALLOY CHANNEL AND METHOD OF FABRICATION THEREOF

(71) Applicant: International Business Machines Corporation, Armonk, NY (US)

(72) Inventors: Kangguo Cheng, Schenectady, NY (US); Bruce B. Doris, Slingerlands, NY (US); Hong He, Schenectady, NY (US); Ali Khakifirooz, Los Altos, CA (US)

(73) Assignee: International Business Machines Corporation, Armonk, NY (US)

( * ) Notice: Subject to any disclaimer, the term of this patent is extended or adjusted under 35 U.S.C. 154(b) by 147 days.

This patent is subject to a terminal disclaimer.

(21) Appl. No.: 15/048,709

(22) Filed: Feb. 19, 2016

(65) Prior Publication Data

US 2016/0172448 A1 Jun. 16, 2016

Related U.S. Application Data

(63) Continuation of application No. 14/471,861, filed on Aug. 28, 2014, now Pat. No. 9,293,588.

(51) Int. Cl.
*H01L 29/66* (2006.01)
*H01L 29/161* (2006.01)
(Continued)

(52) U.S. Cl.
CPC ...... *H01L 29/161* (2013.01); *H01L 21/02381* (2013.01); *H01L 21/02532* (2013.01);
(Continued)

(58) Field of Classification Search
CPC . H01L 29/78; H01L 29/785; H01L 29/66795; H01L 29/161; H01L 29/1054;
(Continued)

(56) References Cited

U.S. PATENT DOCUMENTS 7,705,345 B2   4/2010   Bedell et al.
7,910,413 B2   3/2011   Zhu
(Continued)

FOREIGN PATENT DOCUMENTS

WO   WO 2013095650 A1 *  6/2013   ....... H01L 29/42392
WO   WO 2013095651 A1 *  6/2013   ....... H01L 29/42392

OTHER PUBLICATIONS

List of IBM Patents or Patent Applications Treated As Related Dated Feb. 19, 2016, 2 Pages.

*Primary Examiner* — Moin M Rahman
(74) *Attorney, Agent, or Firm* — Scully, Scott, Murphy & Presser, P.C.; Steven J. Meyers

(57) ABSTRACT

A gate cavity is formed exposing a portion of a silicon fin by removing a sacrificial gate structure that straddles the silicon fin. An epitaxial silicon germanium alloy layer is formed within the gate cavity and on the exposed portion of the silicon fin. Thermal mixing or thermal condensation is performed to convert the exposed portion of the silicon fin into a silicon germanium alloy channel portion which is laterally surrounded by silicon fin portions. A functional gate structure is formed within the gate cavity providing a finFET structure having a silicon germanium alloy channel portion which is laterally surrounded by silicon fin portions.

10 Claims, 7 Drawing Sheets

(51) Int. Cl.
  *H01L 21/02* (2006.01)
  *H01L 29/165* (2006.01)
  *H01L 29/78* (2006.01)
  *H01L 29/417* (2006.01)
  *H01L 29/10* (2006.01)

(52) U.S. Cl.
  CPC ........ *H01L 29/1054* (2013.01); *H01L 29/165* (2013.01); *H01L 29/41783* (2013.01); *H01L 29/6681* (2013.01); *H01L 29/66545* (2013.01); *H01L 29/66795* (2013.01); *H01L 29/785* (2013.01); *H01L 29/7842* (2013.01); *H01L 29/7851* (2013.01)

(58) Field of Classification Search
  CPC ............. H01L 29/165; H01L 29/66545; H01L 29/0649; H01L 29/7848; H01L 29/0847; H01L 29/0673; H01L 29/78696; H01L 29/42392; H01L 29/7849
  USPC ................ 438/157, 283, 478, 297, 197, 229
  See application file for complete search history.

(56) References Cited

U.S. PATENT DOCUMENTS

| | | | |
|---|---|---|---|
| 8,476,706 | B1 | 7/2013 | Chidambarrao et al. |
| 2011/0049613 | A1* | 3/2011 | Yeh .................. H01L 29/66795 257/327 |
| 2011/0230017 | A1* | 9/2011 | Khater ................ H01L 29/7839 438/151 |
| 2011/0309446 | A1* | 12/2011 | Doris ...................... H01L 21/84 257/351 |
| 2012/0032732 | A1* | 2/2012 | Xiao ..................... H01L 21/845 327/537 |
| 2012/0138886 | A1 | 6/2012 | Kuhn et al. |
| 2012/0319211 | A1 | 12/2012 | Van Dal et al. |
| 2013/0217220 | A1* | 8/2013 | Jagannathan ... H01L 21/823821 438/592 |
| 2014/0027816 | A1 | 1/2014 | Cea et al. |
| 2014/0231914 | A1* | 8/2014 | Chang ................ H01L 29/66545 257/347 |
| 2014/0361368 | A1 | 12/2014 | Kerber et al. |
| 2015/0008490 | A1* | 1/2015 | Strain ............... H01L 29/66795 257/288 |
| 2015/0137263 | A1* | 5/2015 | Lee ........................ H01L 29/785 257/401 |
| 2015/0194525 | A1 | 7/2015 | Xu et al. |

* cited by examiner

US 10,446,650 B2

FINFET WITH A SILICON GERMANIUM ALLOY CHANNEL AND METHOD OF FABRICATION THEREOF

BACKGROUND

The present application relates to a non-planar semiconductor structure and a method of forming the same. More particularly, the present application relates to a FinFET device containing a silicon germanium alloy channel and a method of forming the same.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (finFETs) is the next step in the evolution of complementary metal oxide semiconductor (CMOS) devices. Semiconductor fin field effect transistors (FETs) can achieve higher drive currents with increasingly smaller dimensions as compared to conventional planar FETs. In order to extend these devices for multiple technology nodes, there is a need to boost the performance with high mobility channels.

SUMMARY

A gate cavity is formed exposing a portion of a silicon fin by removing a sacrificial gate structure that straddles the silicon fin. An epitaxial silicon germanium alloy layer is formed within the gate cavity and on the exposed portion of the silicon fin. Thermal mixing or thermal condensation is performed to convert the exposed portion of the silicon fin into a silicon germanium alloy channel portion which is laterally surrounded by silicon fin portions. A functional gate structure is formed within the gate cavity providing a finFET structure having a silicon germanium alloy channel portion which is laterally surrounded by silicon fin portions.

In one aspect of the present application, a semiconductor structure is provided. In one embodiment, the semiconductor structure includes a semiconductor fin comprising a silicon germanium alloy channel portion positioned laterally between a silicon fin source portion and a silicon fin drain portion. The structure further includes a functional gate structure straddling the semiconductor fin and located directly above the silicon germanium alloy channel portion.

In another aspect of the present application, a method of forming a semiconductor structure is provided. In one embodiment, the method of forming the semiconductor structure includes forming a sacrificial gate structure straddling a portion of a silicon fin. A dielectric material is formed over the silicon fin and having a topmost surface that is coplanar with a topmost surface of the sacrificial gate structure. The sacrificial gate structure is removed to provide a gate cavity exposing a portion of the silicon fin. The exposed portion of the silicon fin is converted into a silicon germanium alloy channel portion. A functional gate structure is then provided in the gate cavity and in direct contact with the silicon germanium alloy channel portion.

DETAILED DESCRIPTION

Figure 1:
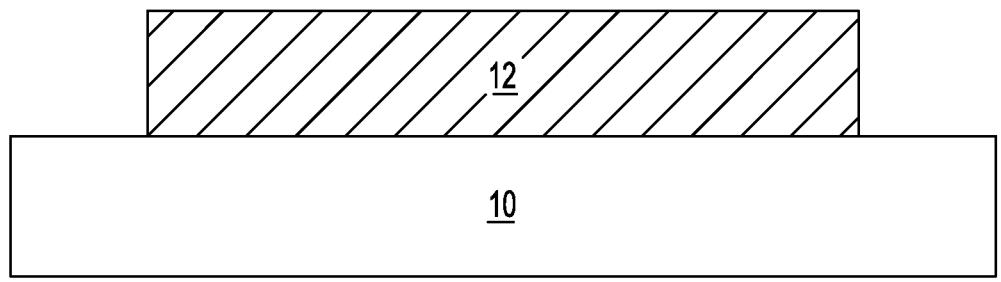
FIG. 1 is a cross sectional view of an exemplary semiconductor structure including a silicon fin located on a surface of a substrate that can be employed in one embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements in the various embodiments of the present application are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Silicon germanium alloys are being considered as a main pFET stress element in future FinFET technologies. Prior processes use silicon germanium epitaxy, thermal mixing or condensation techniques to form fins in the pFET device region that are comprised entirely of a silicon germanium alloy (i.e., SiGe). The SiGe fins are formed in prior art processes prior to device processing. The three dimensional nature of FinFETs requires extensive spacer over etching to clear the spacer dielectric from the sidewall surfaces of the SiGe fins. Spacer over etch will damage the SiGe fins. Thus, there is needed a method of forming a fin containing a SiGe alloy portion within an otherwise non-silicon germanium alloy fin that overcomes the foregoing and other drawbacks that are associated with prior art processes.

Referring to FIG. 1, there is illustrated an exemplary semiconductor structure including a silicon fin 12 located on, and extending upward from, a surface of a substrate 10 that can be employed in one embodiment of the present application. It is noted that although a single silicon fin is described and illustrated, the present application contemplates embodiments in which a plurality of silicon fins can be formed on the surface of substrate 10.

As used herein, a "fin" refers to a contiguous structure including a semiconductor material, in the present case silicon, and including a pair of vertical sidewalls that are parallel to each other. As used herein, a surface is "vertical" if there exists a vertical plane from which the surface does not deviate by more than three times the root mean square roughness of the surface.

In one embodiment of the present application, the silicon fin 12 has a height from 10 nm to 100 nm, and a width from 4 nm to 30 nm. In another embodiment of the present application, the silicon fin 12 has a height from 15 nm to 50 nm, and a width from 5 nm to 12 nm. When a plurality of silicon fins is formed, each silicon fin is spaced apart from its nearest neighboring silicon fin and each silicon fin is oriented parallel to each other. In some embodiments, the silicon fin 12 can be stained. In other embodiments, the silicon fin 12 is unstrained.

In one embodiment of the present application, substrate 10 is lower portion of a bulk silicon substrate that was not patterned, while the silicon fin 12 represents an upper portion of the bulk silicon substrate that was patterned. In such an embodiment, no material interface exists between the silicon fin 12 and the substrate 10. The term "bulk" as used in conjunction with the phrase "silicon substrate" denotes that the entire substrate is comprised of silicon.

In some embodiments of the present application, the bulk silicon substrate may be single crystalline silicon. In other embodiments of the present application, the bulk silicon substrate may be polycrystalline silicon or amorphous silicon. The crystal orientation of the bulk silicon substrate may be {100}, {110}, or {111}. Other crystallographic orientations besides those specifically mentioned can also be used in the present application.

In another embodiment, the substrate 10 comprises a different semiconductor material besides silicon. Illustrative examples of other semiconductor materials besides silicon include, but are not limited to, a silicon germanium alloy, germanium, and III-V compound semiconductors such as, for example, GaAs, InAs, GaP, and InP. In such an embodiment, the other semiconductor material that provides substrate 10 may be a single crystalline semiconductor material, a polycrystalline semiconductor material or an amorphous semiconductor material. Also, in such an embodiment the other semiconductor material may have a same or different crystal orientation as that of the silicon fin 12. When substrate 10 is another semiconductor material, a semiconductor material interface is present between the substrate 10 and the silicon fin 12.

In yet a further embodiment of present application, the substrate 10 is an insulator layer such as, for example, an oxide, nitride and/or oxynitride. In one embodiment, the substrate 10 is comprised of silicon dioxide, boron nitride, boron oxynitride, and/or silicon nitride. In such an embodiment, a handle substrate can be located beneath the insulator layer and the silicon fin 12 can be derived from an upper semiconductor material layer of a semiconductor-on-insulator substrate. The handle substrate may be comprised of any semiconductor material including, but not limited to, silicon, a silicon germanium alloy, germanium, silicon carbide, and III-V compound semiconductor materials.

In some embodiments, and prior to forming the silicon fin 12, a hard mask layer (not shown) can be formed on an exposed surface of the semiconductor material from which the silicon fin 12 is derived from. When present, the hard mask layer is a contiguous layer that covers the entirety of the topmost surface of the semiconductor material from which the silicon fin 12 is derived from. The hard mask layer may include a semiconductor oxide, a semiconductor nitride and/or a semiconductor oxynitride. In one embodiment, the hard mask material that can be used in providing the hard mask layer can be comprised of silicon dioxide. In another embodiment, the hard mask material that can be used in providing the hard mask layer can be comprised of silicon nitride. In yet another embodiment, the hard mask material that can be used in providing the hard mask layer can be a stack comprised of, in any order, silicon dioxide and silicon nitride.

In some embodiments, the hard mask material that can be used in providing the hard mask layer can be formed by a deposition process such as, for example, chemical vapor deposition (CVD) and plasma enhanced chemical vapor deposition (PECVD). In other embodiments, the hard mask material that can be used in providing the hard mask layer can be formed by a thermal process such as, for example, thermal oxidation and/or thermal nitridation. In yet other embodiments, the hard mask material that can be used in providing the hard mask layer can be formed by a combination of a deposition process and a thermal process. The thickness of the hard mask material that can be used in providing the hard mask layer can range from 2 nm to 100 nm, with a thickness from 3 nm to 40 nm being more typical.

The silicon fin 12 (or plurality of silicon fins) can be formed by patterning. In one embodiment, the patterning process includes a sidewall image transfer (SIT) process. The SIT process includes forming a contiguous mandrel material layer (not shown) on either the topmost surface of the semiconductor material from which the silicon fin 12 is derived from or, if present, on the topmost surface of the hard mask layer. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon, polysilicon, silicon dioxide or silicon nitride. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form at least one mandrel structure (also not shown) on either the topmost surface of the semiconductor material from which the silicon fin 12 is derived from or, if present, on the topmost surface of the hard mask layer.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), and atomic layer deposition (ALD). Examples of etching that be used in providing the dielectric spacer include any etching process such as, for example, reactive ion etching. Since the dielectric spacer are used in the SIT process as an etch mask, the width of the each dielectric spacer determines the width of each silicon fin.

After formation of the dielectric spacer, the SIT process continues by removing each mandrel structure. Each mandrel structure can be removed by an etching process that is selective for removing the mandrel material as compared to the material of the dielectric spacer and, if present, the hard mask layer. Following the mandrel structure removal, the SIT process continues by transferring the patterned provided by the dielectric spacer into the hard mask layer, if present, and then into the semiconductor material from which the silicon fin 12 is derived from. The pattern transfer may be achieved by an etching process. Examples of etching processes that can used to transfer the pattern may include dry etching (i.e., reactive ion etching, plasma etching, ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacer from the structure. Each dielectric spacer may be removed by etching or a planarization process. Also, and after the SIT process, the remaining portions of the hard mask layer can be removed to expose the topmost surface of the silicon fin 12.

Alternatively, and in another embodiment of the present application, the patterning used in providing the silicon fin 12 may comprise lithography and etching.

Figure 2:
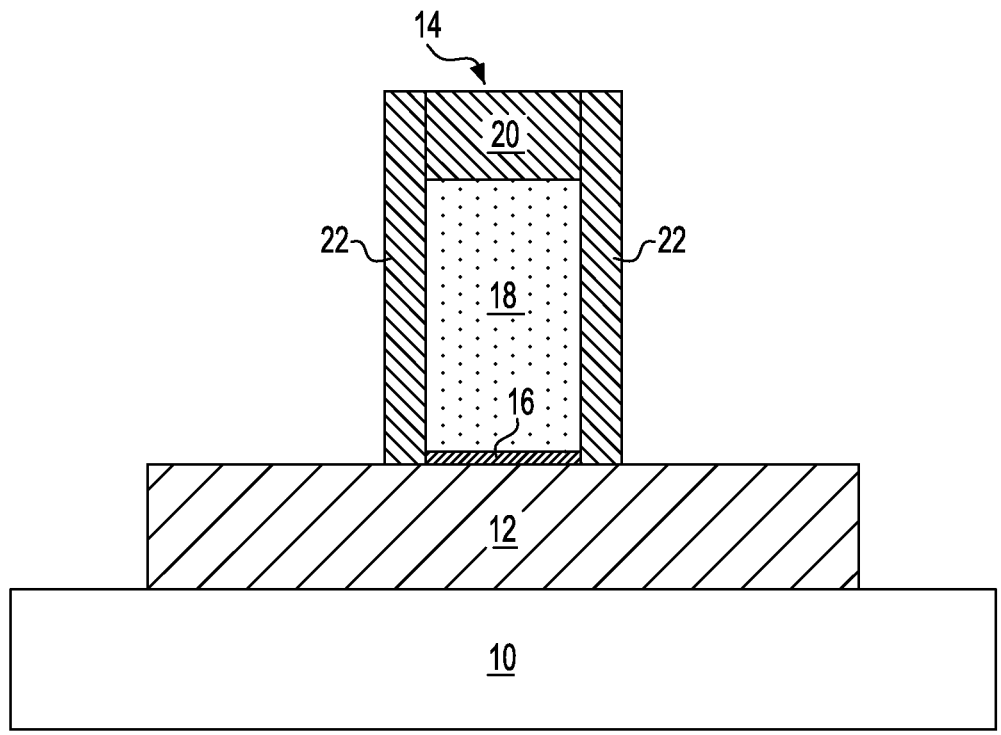
FIG. 2 is a cross sectional view of the exemplary semiconductor structure of FIG. 1 after forming a sacrificial gate structure and a dielectric spacer each straddling a portion of the silicon fin.

Referring now to FIG. 2, there is illustrated the exemplary semiconductor structure of FIG. 1 after forming a sacrificial gate structure 14 and a dielectric spacer 22. It is noted that while the cross sectional view illustrates the sacrificial gate structure 14 and the dielectric spacer 22 on the topmost surface of the silicon fin 12, the sacrificial gate structure 14 and dielectric spacer 22 would also be located on each sidewall surface of the silicon fin 12, since the sacrificial gate structure 14 and dielectric spacer 22 that are formed straddle (i.e, they are formed laterally adjacent to and above) the silicon fin 12. A single sacrificial gate structure can be formed or a plurality of sacrificial gate structures can be formed. Each sacrificial gate structure 14 lies perpendicular to each silicon fin 12.

As shown, a topmost surface of each dielectric spacer 22 is coplanar with a topmost surface of the sacrificial gate structure 14. As is also shown, the dielectric spacer 22 is formed on sidewall surfaces of the sacrificial gate structure 14. In some embodiments (not shown), dielectric spacer 22 can be omitted or formed later on in the process. For example, the dielectric spacer 22 can be formed after removing the sacrificial gate structure 14 and prior to forming a functional gate structure 30 in a gate cavity 26 providing by removing the sacrificial gate structure 14.

The term "sacrificial gate structure" is used throughout the present application to denote a material that serves or alternatively, materials that serve, as a placeholder structure for a functional gate structure to be subsequently formed. The sacrificial gate structure 14 may include an optional sacrificial dielectric material portion 16, a sacrificial gate material portion 18 and an optional sacrificial dielectric cap portion 20.

The sacrificial gate structure 14 can be formed by first providing a sacrificial material stack comprising, from bottom to top, an optional blanket layer of a sacrificial dielectric material, a blanket layer of a sacrificial gate material, and an optional blanket layer of a sacrificial dielectric cap material. After providing the sacrificial material stack, the sacrificial material stack is patterned by lithography and etching forming the sacrificial gate structure 14. A remaining portion of the sacrificial dielectric material provides the sacrificial dielectric material portion 16 of the sacrificial gate structure 14, a remaining portion of the sacrificial gate material provides the sacrificial gate material portion 18 of the sacrificial gate structure 14, and a remaining portion of the sacrificial dielectric cap material provides the sacrificial dielectric cap portion 20 of the sacrificial gate structure 14.

In the embodiment illustrated in FIG. 2, the sacrificial dielectric material portion 16, the sacrificial gate material portion 18 and the sacrificial dielectric cap portion 20 are present and each has sidewall surfaces that are vertically coincident to each other.

In one embodiment and when present, the sacrificial dielectric material portion 16 may include a semiconductor oxide, a semiconductor nitride, and/or a semiconductor oxynitride. In one example, the sacrificial dielectric material portion 16 may be composed of silicon dioxide, silicon nitride and/or silicon oxynitride. In another embodiment of the present application, sacrificial dielectric material portion 16 may include at least a dielectric metal oxide. Exemplary dielectric metal oxides that can be used in providing the sacrificial dielectric material portion 16 include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. The sacrificial dielectric material portion 16 may include a single dielectric material layer. In other embodiments, the sacrificial dielectric material portion 16 may include a multilayered sacrificial gate dielectric structure. The thickness of the sacrificial dielectric material portion 16 can range from 1 nm to 10 nm, although lesser and greater thicknesses can also be employed.

In some embodiments of the present application, the sacrificial dielectric material used in providing the sacrificial dielectric material portion 16 can be formed by a deposition technique such as, for example, chemical vapor deposition (CVD), plasma enhanced chemical vapor deposition (PECVD), physical vapor deposition (PVD), sputtering, or atomic layer deposition. In another embodiment of the present application, the sacrificial dielectric material used in providing the sacrificial dielectric material portion 16 can be formed by a thermal growth technique such as, for example, thermal oxidation and/or thermal nitridation. In yet a further embodiment of the present application, a combination of a deposition and thermal growth may be used in forming a multilayered sacrificial dielectric material portion 16.

The sacrificial gate material portion 18 can include any material (semiconductor, dielectric or conductive) that can be selectively removed from the structure during a subsequently performed etching process. In one embodiment, the sacrificial gate material portion 18 may be composed of amorphous Si or polysilicon. In another embodiment, the sacrificial gate material portion 18 may be composed of a metal such as, for example, Al, W, or Cu. The sacrificial gate material that is used in providing the sacrificial gate material portion 18 can be formed, for example, by chemical vapor deposition or plasma enhanced chemical vapor deposition. The thickness of sacrificial gate material portion 18 can be from 50 nm to 300 nm, although lesser and greater thicknesses can also be employed.

When present, the sacrificial dielectric cap portion 20 may be composed of a dielectric oxide, dielectric nitride and/or a dielectric oxynitride nitride. In one embodiment, the sacrificial dielectric cap portion 20 can be composed of silicon dioxide, a silicon nitride and/or a silicon oxynitride. In one embodiment, the sacrificial dielectric cap material used in providing the sacrificial dielectric cap portion 20 can be formed utilizing a thermal process such as, for example, a thermal oxidation or a thermal nitridation process. In another embodiment, the sacrificial dielectric cap material used in providing the sacrificial dielectric cap portion 20 can be formed by a deposition process such as, for example, chemical vapor deposition (CVD), and plasma enhanced chemical vapor deposition (PECVD). The thickness of the sacrificial dielectric cap portion 20 can be from 5 nm to 50 nm, although lesser and greater thicknesses can also be employed.

The dielectric spacer 22 entirely covers the sidewall surfaces of the sacrificial gate structure 14. The dielectric spacer 22 also straddles a portion of the silicon fin 12. The dielectric spacer 22 can be provided by depositing a layer of a dielectric spacer material and then performing an etch. The dielectric spacer material that is used in providing the dielectric spacer 22 comprises a dielectric material that differs from any of the materials that provide the sacrificial gate structure 14. In one embodiment of the present application, the dielectric spacer material that is used in providing the dielectric spacer 22 may be a dielectric material having a dielectric constant that is equal to or even greater than that of silicon dioxide (such dielectric materials may be referred to herein as high k). Examples of high k dielectric materials include, for example, silicon dioxide, silicon nitride and silicon oxynitride. In another embodiment of the present application, the dielectric spacer material that is used in providing the dielectric spacer 22 may be a dielectric material having a dielectric constant of less than silicon dioxide (such dielectric materials may be referred to herein as low k). Examples of dielectric materials having a low dielectric constant include, but are not limited to, silsesquioxanes, C-doped oxides (i.e., organic silicates) that include atoms of Si, C, O and H, and thermosetting polyarylene ethers. The term "polyarylene" is used throughout the present application to denote aryl moieties or inertly substituted aryl moieties which are linked together by bonds, fused rings, or inert linking groups such as, for example, oxygen, sulfur, sulfone, sulfoxide, carbonyl and the like.

In some embodiments of the present application (not shown), portions of the silicon fin 12 not covered by the sacrificial gate structure 14 and the dielectric spacer 22 can be doped with a p-type dopant or an n-type dopant forming source/drain regions of the structure. In some embodiments, doping of portions of the silicon fin 12 can be performed later on in the process of the present application. The term "p-type" refers to the addition of impurities to an intrinsic semiconductor that creates deficiencies of valence electrons. Examples of p-type dopants, i.e., impurities, include, but are not limited to, boron, aluminum, gallium and indium. "N-type" refers to the addition of impurities that contributes free electrons to an intrinsic semiconductor. Examples of n-type dopants, i.e., impurities, include, but are not limited to, antimony, arsenic and phosphorous. In some embodiments, the dopant may be introduced into the exposed portions of each silicon fin 12 by ion implantation, plasma doping or gas phase doping. The concentration of dopants used in providing the source/drain regions can range from $5e18$ atoms/$cm^3$ to $1.5e21$ atoms/$cm^3$.

Figure 3:
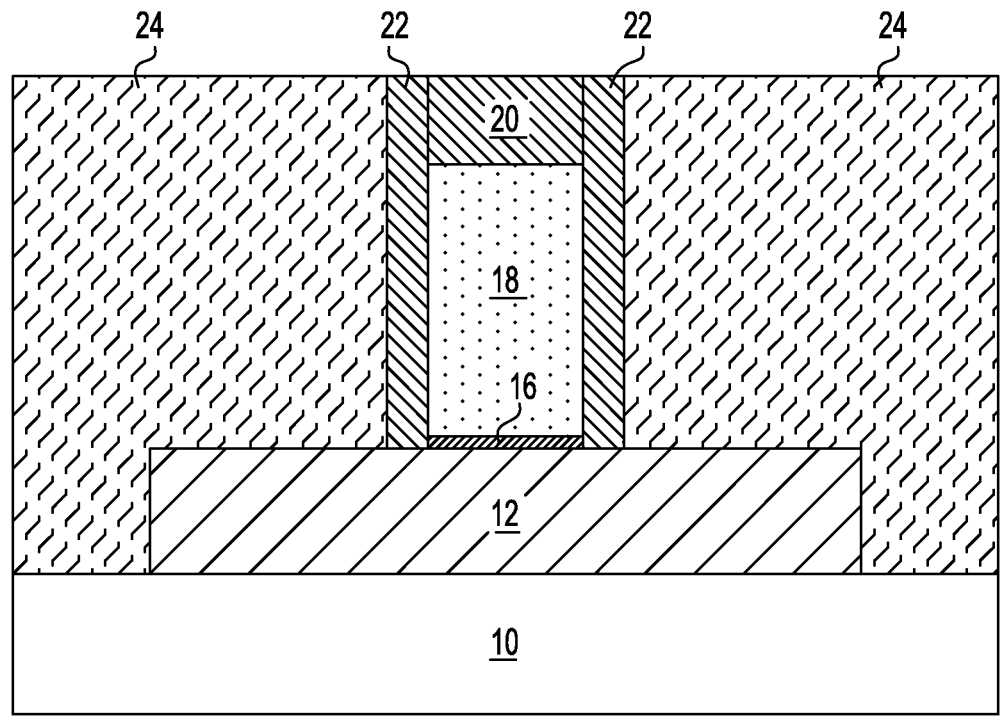
FIG. 3 is a cross sectional view of the exemplary semiconductor structure of FIG. 2 after forming a dielectric material having a topmost surface that is coplanar with a topmost surface of the sacrificial gate structure.

Referring now to FIG. 3, there is illustrated the exemplary semiconductor structure of FIG. 2 after forming a dielectric material 24 having a topmost surface that is coplanar with a topmost surface of sacrificial gate structure 14. The dielectric material 24 comprises a dielectric material which differs from any materials that provide the sacrificial gate structure 14 or the dielectric spacer 22. In some embodiments, the dielectric material 24 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the dielectric material 24. The use of a self-planarizing dielectric material as dielectric material 24 may avoid the need to perform a subsequent planarizing step.

In one embodiment, the dielectric material 24 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as dielectric material 24, a planarization process or an etch back process follows the deposition of the dielectric material. The thickness of the dielectric material 24 that can be employed in the present application may vary depending on the type of dielectric material employed as well as the method that was employed in forming the same. In one embodiment, the dielectric material 24 has a thickness from 80 nm to 500 nm. Other thicknesses that are greater or lesser than the range provided above can also be used for the dielectric material 24.

Figure 4:
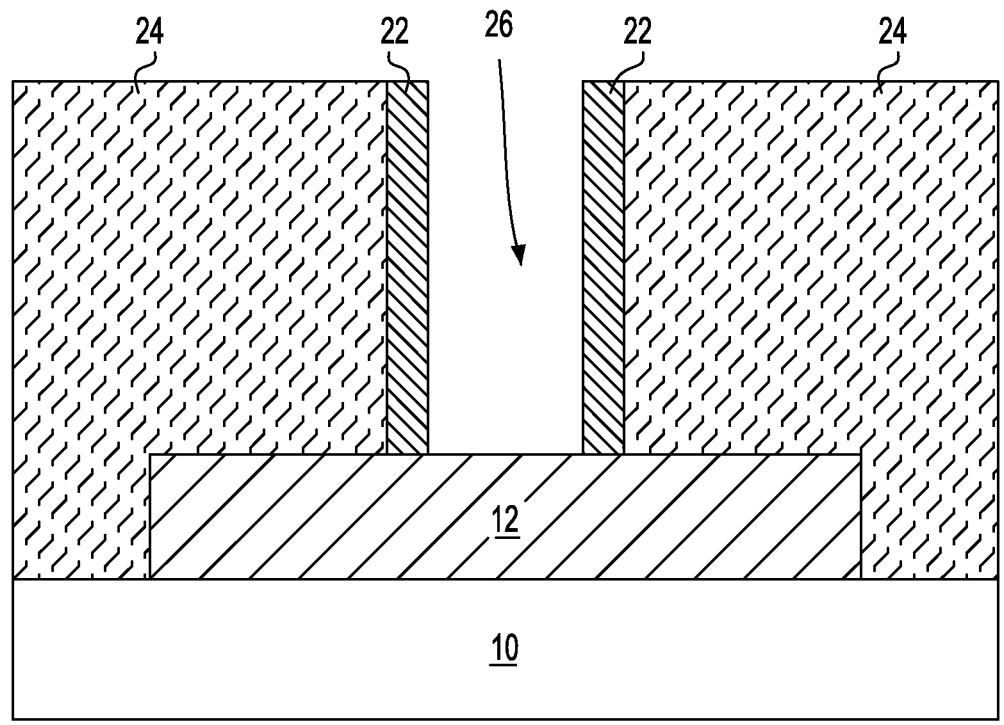
FIG. 4 is a cross sectional view of the exemplary semiconductor structure of FIG. 3 after removing the sacrificial gate structure to provide a gate cavity that exposes a portion of the silicon fin.

Referring now to FIG. 4, there is illustrated the exemplary semiconductor structure of FIG. 3 after removing the sacrificial gate structure 14 to provide a gate cavity 26 that exposes a portion of the silicon fin 12. The sacrificial gate structure 14 can be removed by one or more etching processes. In one example, a reactive ion etch can be used to removal the various materials that provide the sacrificial gate structure 14. The portion of the exposed silicon fin 12 at the bottom of the gate cavity 26 will be further processed and serve as a channel region of the finFET device.

Figure 5:
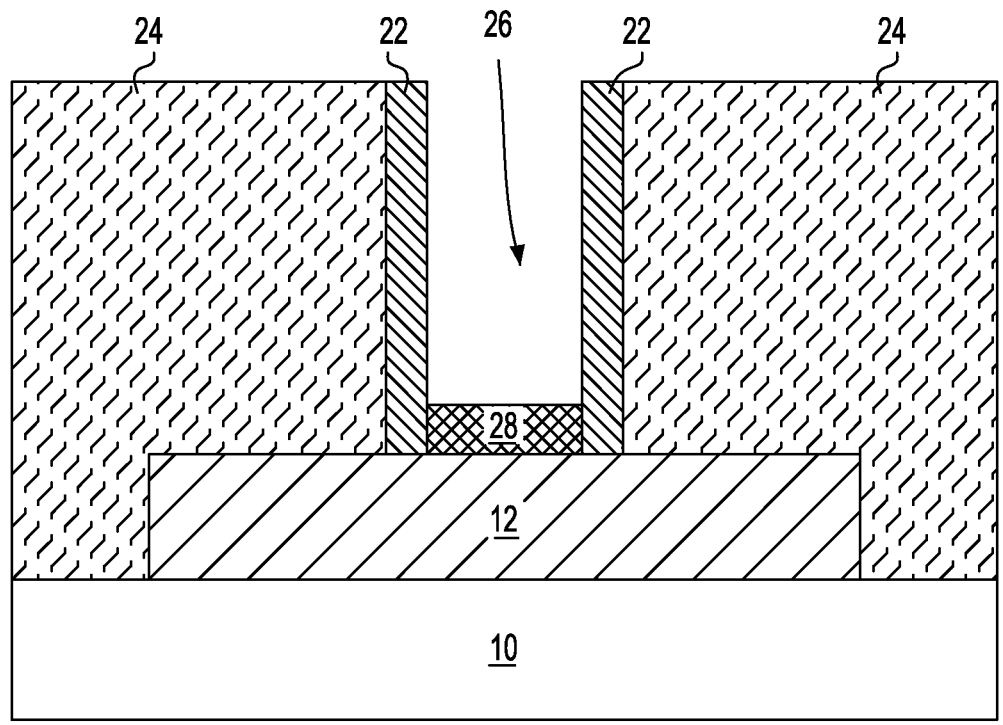
FIG. 5 is a cross sectional view of the exemplary semiconductor structure of FIG. 4 after forming a silicon germanium alloy layer within the gate cavity and on the exposed portion of the silicon fin.

Referring now to FIG. 5, there is illustrated the exemplary semiconductor structure of FIG. 4 after forming a silicon germanium alloy layer 28 within the gate cavity 26 and on the exposed portion of the silicon fin 12, i.e., the silicon germanium alloy layer 28 is formed on an exposed topmost and sidewall surfaces of the silicon fin 12.

The silicon germanium alloy layer 28 that is formed can have a germanium content of from 20 atomic percent to 80 atomic percent and the remainder being silicon. The silicon germanium alloy layer 28 may be compositional graded or compositional ungraded. The thickness of the silicon germanium alloy layer 28 can be from 2 nm to 15 nm. Thickness that are lesser than or greater than the aforementioned thickness range can also be used as the thickness of the silicon germanium alloy layer 28.

The silicon germanium alloy layer 28 can be formed by an epitaxial growth (or deposition) process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. Thus, in the present application, the silicon germanium alloy layer 28 has an epitaxial relationship, i.e., same crystal orientation, with the underlying exposed portion of the silicon fin 12.

In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth process apparatuses that are suitable for use in forming the silicon germanium alloy layer 28 of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the silicon germanium alloy layer 28 typically ranges from 550° C. to 900° C. Although higher temperature typically results in faster deposition, the faster deposition may result in crystal defects and film cracking.

A number of different source gases may be used for the epitaxial deposition of the silicon germanium alloy layer 28. In some embodiments, the source gas for the epitaxial deposition of the silicon germanium alloy layer 28 includes a mixture of a silicon containing gas source and a germanium containing gas source. Examples of silicon source gases that can be used include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium source gases that can be used include germane, digermane, halogermane, dichlorogermane, trichlorogermane, tetrachlorogermane and combinations thereof. In some embodiments, a single source gas that includes a silicon component and a germanium component may be used in forming the epitaxial the silicon germanium alloy layer 28. Carrier gases like hydrogen, nitrogen, helium and argon can be used during the epitaxial growth process.

Figure 6:
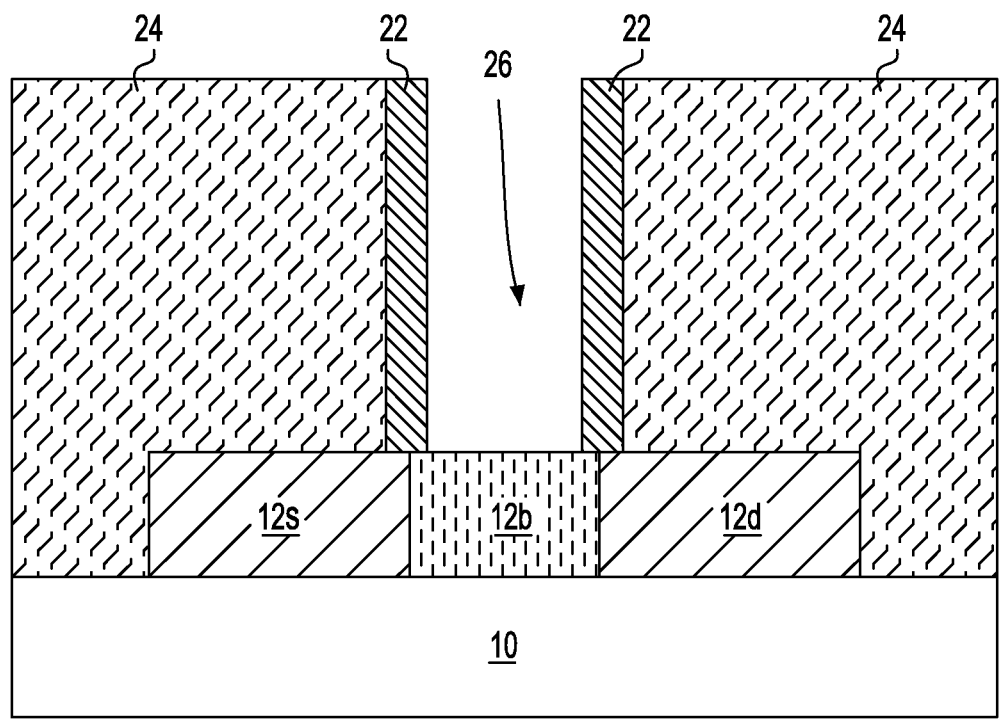
FIG. 6 is a cross sectional view of the exemplary semiconductor structure of FIG. 5 after performing a thermal mixing process or a thermal condensation process in which a silicon germanium alloy channel portion is formed within the exposed portion of the silicon fin.

Referring now to FIG. 6, there is illustrated the exemplary semiconductor structure of FIG. 5 after performing a thermal mixing process or a thermal condensation process in which a silicon germanium alloy channel portion 12b is formed within the exposed portion of the silicon fin 12. In the present application, the exposed portion of the silicon fin at the bottom of the gate cavity 26 is converted into a silicon germanium alloy channel portion 12b utilizing the silicon germanium alloy layer 28 as a germanium source material. The silicon germanium alloy channel portion 12b extends from the topmost surface of the exposed portion of the silicon fin 12 to the bottommost surface of the exposed portion of the silicon fin 12. The remaining portions of the silicon fin 12 that are located laterally between (i.e., on either side of the silicon germanium alloy channel portion 12b) and in direct contact with sidewall surfaces of the silicon germanium alloy channel portion 12b may be referred to herein as a silicon fin source portion 12s (i.e., a portion of the silicon fin in which a source region can be present) and a silicon fin drain portion 12d (i.e., a portion of the silicon fin in which a drain region can be present). Collectively, the silicon fin source portion 12s, the silicon germanium alloy channel portion 12b, and the silicon fin drain portion 12d provide a semiconductor fin of the present application. In accordance with the present application, the silicon fin source portion 12s, the silicon germanium alloy channel portion 12b, and the silicon fin drain portion 12d lie within a same horizontal plane.

The silicon germanium alloy channel portion 12b that is formed has a topmost surface that is coplanar with a topmost surface of both the silicon fin source portion 12s and the silicon fin drain portion 12d. Also, the silicon germanium alloy channel portion 12b that is formed has a bottommost surface that is coplanar with a bottommost surface of both the silicon fin source portion 12s and the silicon fin drain portion 12d. Further, the bottommost surface of the silicon germanium alloy channel portion 12b is in direct contact with a portion of the topmost surface of substrate 10. In one embodiment and as shown in the drawings, the silicon germanium alloy channel portion 12b that is formed has sidewall surfaces that extend beneath the dielectric spacer 22. In other embodiments (not shown) and when the dielectric spacer 22 is not present, the silicon germanium alloy channel portion 12b that is formed has sidewall surfaces that extend beneath the dielectric material 24. Thus, the sidewall surfaces of the silicon germanium alloy channel portion 12b are not vertically coincident with the sidewall surfaces of the gate cavity 26. The silicon germanium alloy channel portion 12b that is formed has a germanium content of from 5 atomic percent to 85 atomic percent and the remainder being silicon.

In one embodiment of the present application, thermal mixing is used in providing the silicon germanium alloy channel portion 12b. Thermal mixing causes the silicon germanium alloy layer 28 to mix into the exposed portion of the silicon fin 12 and thus form the silicon germanium alloy channel portion 12b. In some embodiments, and follow thermal mixing, an etch back process may be used to reduce the thickness of the silicon germanium alloy channel portion 12b and to provide the structure shown in FIG. 6.

In one embodiment of the present application, thermal mixing is performed at a temperature from 700° C. to 1300° C. In another embodiment of the present application, thermal mixing is performed at a temperature from 1000° C. to 1200° C. Thermal mixing is performed in an inert ambient. By "inert" it is meant an ambient that includes an inert gas such as He, Ar, $N_2$, Xe, Kr, or Ne. Thermal mixing may be carried out for a variable period of time. In one example, thermal mixing can be carried out for a time period from 5 seconds to about 5 hours, depending on thermal mixing temperature. In another embodiment, thermal mixing may be carried out for a time period from 5 minutes to about 30 minutes. Thermal mixing may be carried out at a single targeted temperature, or various ramp and soak cycles using various ramp rates and soak times can be employed.

In another embodiment of the present application, thermal condensation, i.e., thermal oxidation, is used in providing the silicon germanium alloy channel portion 12b. When thermal condensation is employed in providing the silicon germanium alloy channel portion 12b, silicon in the silicon germanium alloy layer 28 is oxidized and germanium is driven out of the silicon germanium alloy layer 28 and into the exposed portion of the silicon fin 12. Thus, thermal condensation converts the exposed portion of the silicon fin 12 into a silicon germanium alloy channel portion 12b, while forming a silicon dioxide layer on the silicon germanium alloy channel portion 12b. The silicon dioxide layer that is formed by thermal condensation can be removed from the structure utilizing a selective etching process.

The thermal condensation process of the present application is a thermal oxidation process that is performed at temperature sufficient enough to cause diffusion of germanium out of the silicon germanium alloy layer 28 and into the exposed portion of the silicon fin 12. In one embodiment of the present application, thermal condensation is performed at a temperature from 700° C. to 1300° C. In another embodiment of the present application, the thermal condensation is performed at a temperature from 1000° C. to 1200° C. Thermal condensation is performed in an oxidizing ambient which includes at least one oxygen-containing gas such as $O_2$, NO, $N_2O$, ozone, air and other like oxygen-containing gases. The oxygen-containing gas may be admixed with each other (such as an admixture of $O_2$ and NO), or the gas may be diluted with an inert gas such as He, Ar, $N_2$, Xe, Kr, or Ne. Thermal condensation may be carried out for a variable period of time. In one example, thermal condensation can be carried out for a time period from 5 seconds to about 5 hours, depending on thermal oxidation temperature and oxidation species. In another embodiment, thermal condensation may be carried out for a time period from 5 minutes to about 30 minutes. Thermal condensation may be carried out at a single targeted temperature, or various ramp and soak cycles using various ramp rates and soak times can be employed.

Figure 7:
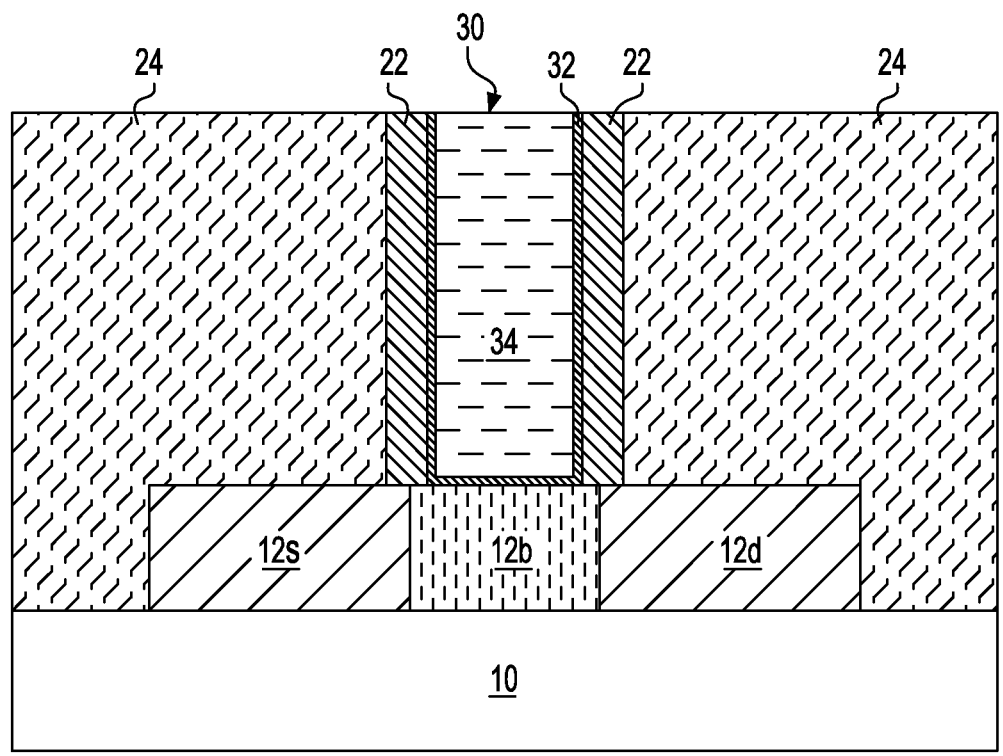
FIG. 7 is a cross sectional view of the exemplary semiconductor structure of FIG. 6 after formation of a functional gate structure in the gate cavity and on the silicon germanium alloy channel portion.

Referring now to FIG. 7, there is illustrated the exemplary semiconductor structure of FIG. 6 after formation of a functional gate structure 30 in the gate cavity 26 and on the silicon germanium alloy channel portion 12b. The term "functional gate structure" is used throughout the present application as a permanent gate structure used to control output current (i.e., flow of carriers in the channel) of a semiconducting device through electrical or magnetic fields. The functional gate structure 30 straddles the silicon germanium alloy channel portion 12b, and thus, the functional gate structure 30 is formed on a topmost surface and sidewall surfaces of the silicon germanium alloy channel portion 12b. The function gate structure 30 lies perpendicular to silicon fin 12. In some embodiments and if not previously formed, dielectric spacer 22 can be formed within the gate cavity 26 prior to forming the functional gate structure.

The functional gate structure 30 includes a gate dielectric portion 32 and a gate conductor portion 34. In some embodiments, and as shown in FIG. 7, the gate dielectric portion 32 is U-shaped having a horizontal portion in direct contact with an uppermost surface of the silicon germanium alloy channel portion 12b and vertical portions that extend upward from the horizontal portion and are located on exposed sidewall surfaces of each dielectric spacer 22, if present, or sidewall surfaces of the dielectric material 24, if a dielectric spacer 22 is not present. Within the gate cavity 26, the gate dielectric portion 32 surrounds the gate conductor portion 34. In another embodiment (not shown), the gate dielectric portion 32 is not U-shaped and thus lacks the vertical portions mentioned above. In such an embodiment, the gate conductor portion 34 that is formed atop the non-U-shaped gate dielectric fills the remaining portion of the gate cavity 26 and thus has outermost edges that directly contact a sidewall surface of each dielectric spacer 22, if present, or a sidewall surface of the dielectric material 24, if a dielectric spacer 22 is not present.

The gate dielectric portion 32 that can be used in the present application can be a semiconductor oxide, a semiconductor nitride, and/or a semiconductor oxynitride. In one example, the gate dielectric portion 32 can be composed of silicon dioxide, silicon nitride and/or silicon oxynitride. In another embodiment of the present application, the gate dielectric portion 32 may include at least a dielectric metal oxide. Exemplary dielectric metal oxides that can be used as gate dielectric portion 32 include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a dielectric metal oxide can be formed and used as the gate dielectric portion 32.

In some embodiments of the present application, the gate dielectric portion 32 can be formed by a deposition technique such as, for example, chemical vapor deposition (CVD), plasma enhanced chemical vapor deposition (PECVD), physical vapor deposition (PVD), sputtering, or atomic layer deposition. In another embodiment of the present application, the gate dielectric portion 32 can be formed by a thermal growth technique such as, for example, thermal oxidation and/or thermal nitridation. In yet a further embodiment of the present application, a combination of a deposition and thermal growth may be used in forming a multilayered gate dielectric structure.

In one embodiment of the present application, the gate dielectric portion 32 can have a thickness in a range from 1 nm to 10 nm. Other thicknesses that are lesser than or greater than the aforementioned thickness range can also be employed for the gate dielectric portion 32.

The gate conductor portion 34 that can be used in the present application can be composed of doped polysilicon, doped silicon germanium, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), or multilayered combinations thereof. In one embodiment, an entirety of the gate conductor portion 34 is comprised of a doped polysilicon or doped polysilicon germanium. In another embodiment, a lower portion of the gate conductor portion 34 is comprised a conductive material other than doped polysilicon or doped polysilicon germanium, and an upper portion of the gate conductor portion 34 is comprised of doped polysilicon or doped silicon germanium.

The gate conductor portion 34 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. In one embodiment, the gate conductor portion 34 has a thickness from 1 nm to 100 nm. Other thicknesses that are lesser than or greater than the aforementioned thickness range can also be employed for the gate conductor portion 34.

In one embodiment of the present application and as is illustrated in FIG. 7, the topmost surfaces of the gate dielectric portion 32 and the topmost surface of the gate conductor portion 34 are coplanar with each other as well as coplanar with a topmost surface of the dielectric material 24. In another embodiment of the present application and when the gate dielectric portion 32 is non-U shaped, the topmost surface the gate conductor portion 34 is coplanar with a topmost surface of the dielectric material 24.

Figure 8:
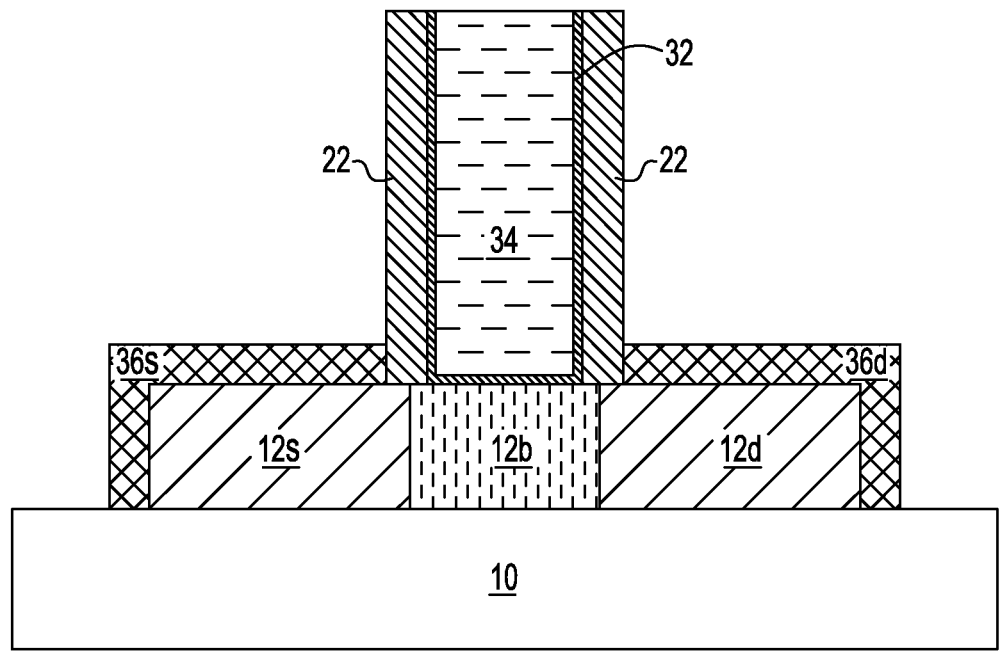
FIG. 8 is a cross sectional view of the exemplary semiconductor structure of FIG. 7 after removing the dielectric material and forming a raised source region and a raised drain region on exposed silicon fin portions that are located laterally between the silicon germanium alloy channel portion.

Referring now to FIG. 8, there is illustrated the exemplary semiconductor structure of FIG. 7 after removing the dielectric material 24 and forming a raised source region 36s and a raised drain region 36d on exposed silicon fin portions (i.e. silicon fin source portion 12s and silicon fin drain portion 12d) that are located laterally between the silicon germanium alloy channel portion 12b. In some embodiments of the present application, dopants (n-type or p-type as described above) can be introduced into the exposed portions of the silicon fin not covered by the functional gate structure 30 and dielectric spacer 22 prior to forming the raised source region 36s and a raised drain region 36d. The dopants can be introduced into the exposed portions of the silicon fin not covered by the functional gate structure 30 and dielectric spacer 22 as described above.

The removal of the dielectric material 24 may be performed utilizing an etching process that is selective in removing the dielectric material 24. In one example, and when the dielectric material 24 comprises silicon dioxide, a selective dry etch process can be used to remove the same from the structure.

The raised source region 36s is formed on one side of the functional gate structure 30, while the raised drain region 36d is formed on the other side of the functional gate structure 30. As is shown, the raised source region 36s is formed on the exposed topmost surface and sidewall surfaces of the silicon fin source portion 12s, while the raised drain region 36d is formed on the exposed topmost surface and sidewall surfaces of the silicon fin drain portion 12d. The raised source region 36s has an epitaxial relationship with the silicon fin source portion 12s, while the raised drain region 36s has an epitaxial relationship with the silicon fin drain portion 12d.

The raised source region 36s and the raised drain region 36d are comprised of an epitaxial semiconductor material that is typically doped with a p-type dopant or an n-type dopant. In one embodiment, doping can be achieved during the deposition of the epitaxial semiconductor material that provides the raised source region 36s and the raised drain region 36d. In another embodiment, doping can be achieved after an intrinsic semiconductor material has been epitaxially deposited using one of the doping techniques mentioned above.

The raised source region 36s and the raised drain region 36d can be formed by an epitaxial deposition process such as described above in forming the silicon germanium alloy layer 28. The conditions and apparatus described above in forming the silicon germanium alloy layer 28 are applicable here for forming the raised source region 36s and the raised drain region 36d.

In one embodiment of the present application, the epitaxial semiconductor material that is used in providing the raised source region 36s and the raised drain region 36d may be the same as that of the semiconductor material of each semiconductor fin; in the present application, the raised source region 36s and the raised drain region 36d can be composed of silicon. In another embodiment of the present application, the epitaxial semiconductor material that is used in providing the raised source region 36s and the raised drain region 36d may be different from the semiconductor material that provides each semiconductor fin; thus since the semiconductor fin is comprised of silicon, the raised source region 36s and the raised drain region 36d can be comprised of another semiconductor material besides silicon.

In some embodiments, the epitaxial growth of the raised source region 36s and the raised drain region 36d can include a dopant gas used in conjunction with the source gas; such a process may be referred to herein as an in-situ doping epitaxial growth process. The dopant gas that can be present in the epitaxial growth process provides a conductivity type, either n-type or p-type, to the epitaxial semiconductor material that provides the raised source region 36s and the raised drain region 36d. When epitaxial semiconductor material portions of an n-type conductivity are to be formed, the dopant gas includes at least one n-type dopant, e.g., phosphorus or arsenic. For example, when phosphorus is the n-type dopant, the dopant gas can be phosphine ($PH_3$), and when arsenic is the n-type dopant, the dopant gas can be arsine ($AsH_3$). In one example, when the conductivity type dopant is n-type, the dopant gas include phosphine gas ($PH_3$) present in a ratio to silane ($SiH_4$) ranging from 0.00001% to 2%. In another example, when the conductivity type dopant is n-type, the dopant gas include phosphine gas ($PH_3$) present in a ratio to silane ($SiH_4$) ranging from 0.0001% to 0.1%.

When epitaxial semiconductor material portions of a p-type conductivity are to be formed, a dopant gas including at least one p-type dopant, e.g., B, is employed as the semiconductor material. For example, when boron is the p-type dopant, the dopant gas can be diborane ($B_2H_6$). In one embodiment, wherein the conductivity type dopant is p-type, the dopant gas may be diborane ($B_2H_6$) present in a ratio to silane ($SiH_4$) ranging from 0.00001% to 2%. In another embodiment, wherein the conductivity type dopant is p-type, the dopant gas may be diborane ($B_2H_6$) present in a ratio to silane ($SiH_4$) ranging from 0.0001% to 0.1%. In yet another embodiment, in which the conductivity type dopant is p-type, the dopant gas for may be trimethylboron (TMB) present in a ratio to silane ($SiH_4$) ranging from 0.1% to 10%.

In one embodiment, in which the raised source region 36s and the raised drain region 36d include a p-type dopant, the p-type dopant is present in a concentration ranging from $1 \times 10^{19}$ atoms/cm$^3$ to $10^{21}$ atoms/cm$^3$. In another embodiment, in which the raised source region 36s and the raised drain region 36d contain p-type dopant, the p-type dopant is present in a concentration ranging from $1 \times 10^{20}$ atoms/cm$^3$ to $8 \times 10^{20}$ atoms/cm$^3$. In one embodiment, in which the raised source region 36s and the raised drain region 36d contain an n-type dopant, the n-type dopant is present in a concentration ranging from $1 \times 10^{19}$ atoms/cm$^3$ to $10^{21}$ atoms/cm$^3$. In another embodiment, in which the raised source region 36s and the raised drain region 36d contain an n-type dopant, the n-type dopant is present in a concentration ranging from $1 \times 10^{20}$ atoms/cm$^3$ to $8 \times 10^{20}$ atoms/cm$^3$. The dopant within the raised source region 36s and the raised drain region 36d can be uniformly present or present as a gradient.

Figure 9:
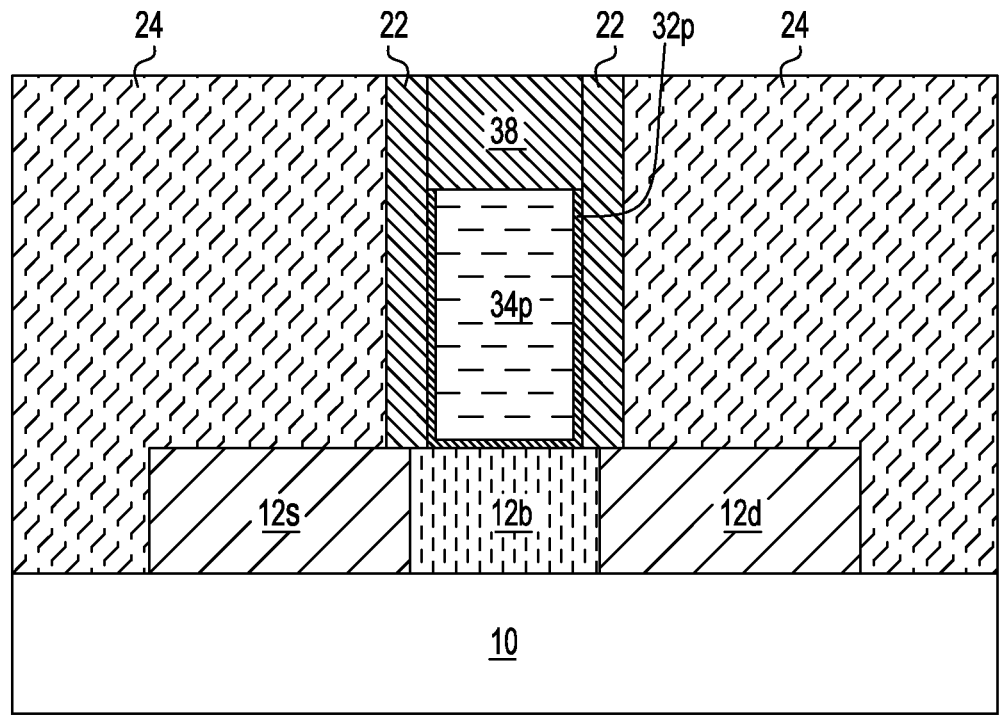
FIG. 9 is a cross sectional view of the exemplary semiconductor structure of FIG. 7 after removing an upper portion of the functional gate structure and forming a dielectric cap within the volume previously occupied by the upper portion of the functional gate structure that was removed in accordance with an embodiment of the present application.

Referring now to FIG. 9, there is illustrated the exemplary semiconductor structure of FIG. 7 after removing an upper portion of the functional gate structure 30 and forming a dielectric cap 38 within the volume previously occupied by the upper portion of the functional gate structure 30 that was removed in accordance with an embodiment of the present application. The structure of this embodiment is formed by first providing the structure shown in FIG. 7. Next, the upper portion of the functional gate structure 30 (including an upper portion of the gate dielectric portion 32 and an upper portion of the gate conductor portion 34) is recessed. After recessing, the recessed portion of the gate dielectric portion is labeled as 32p, while the recessed portion of the gate conductor portion is labeled as 34p. The recessing may be performed utilizing one or more etching processes.

Next, and within the volume previously occupied by the upper portion of the functional gate structure 30, a dielectric cap 38 is formed. The dielectric cap 38 includes one of the materials mentioned above for the optional sacrificial dielectric cap 20. The dielectric cap 38 can be formed by deposition, followed by a planarization process. As is shown, the dielectric cap 38 has a bottommost surface that contacts the topmost surface of both the remaining gate dielectric portion 32p and the remaining gate conductor portion 34p. In some embodiments (not shown) and when the gate dielectric portion is non-U shaped, the dielectric cap 38 has a bottommost surface that only contacts a topmost surface of the remaining gate conductor portion 34p. After providing the dielectric cap 38, the dielectric material 24 can be removed as disclosed in providing the structure shown in FIG. 8.

Figure 10:
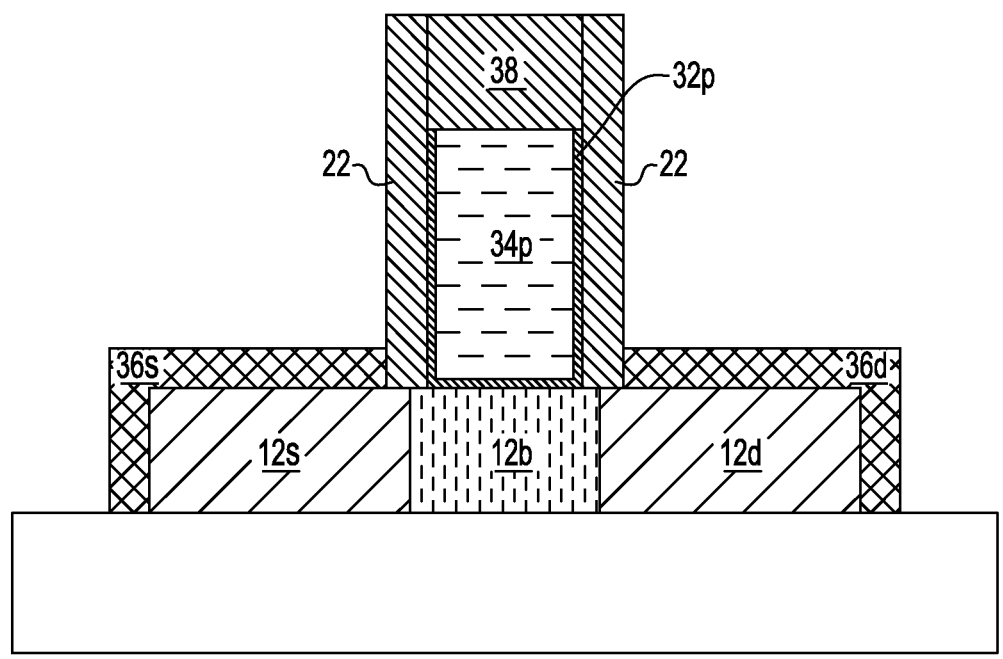
FIG. 10 is a cross sectional view of the exemplary semiconductor structure of FIG. 9 after removing the dielectric material and forming a raised source region and a raised drain region on exposed silicon fin portions that are located laterally between the silicon germanium alloy channel portion.

Referring to FIG. 10, there is illustrated the exemplary semiconductor structure of FIG. 9 after removing dielectric material 24 and forming a raised source region 36s and a raised drain region 36d on exposed silicon fin portions (i.e., the silicon fin source portion 12s and the silicon fin drain portion 12d) that are located laterally between the silicon germanium alloy channel portion 12d. Dielectric material 24 can be removed as described above. The raised source region 36s and the raised drain region 36d of this embodiment can be formed and include materials and dopants as described above in forming the raised source region 36s and the raised drain region 36d in providing the structure shown in FIG. 8 of the present application.

Figure 11:
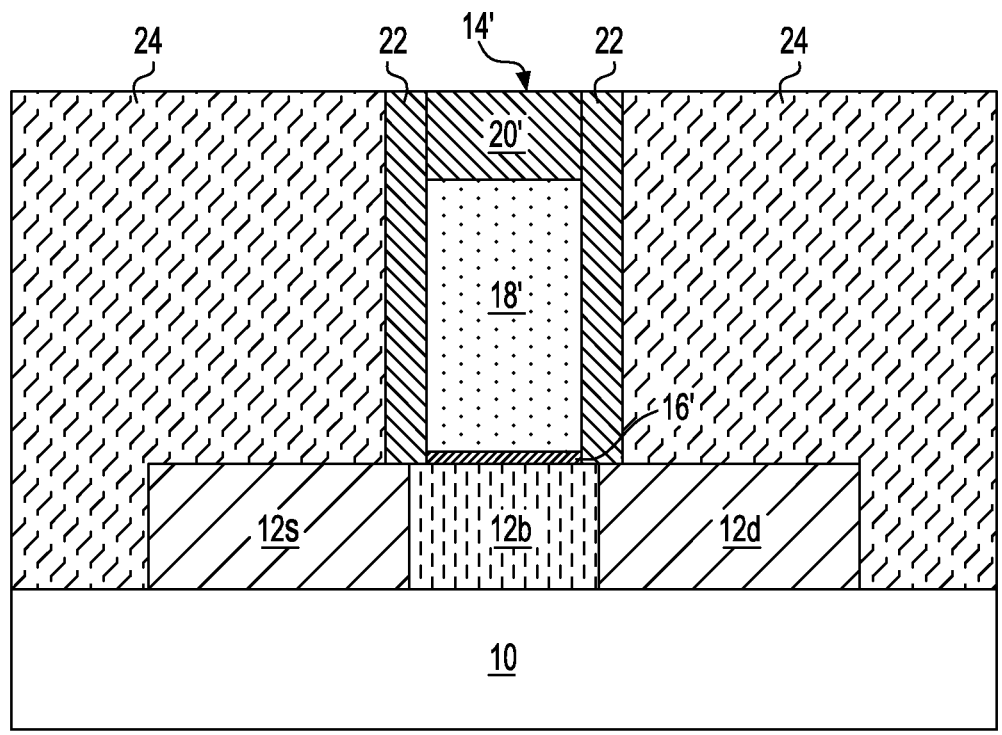
FIG. 11 is a cross sectional view of the exemplary semiconductor structure of FIG. 6 after forming another sacrificial gate structure in the gate cavity in accordance with yet another embodiment of the present application.

Referring now to FIG. 11, there is illustrated the exemplary semiconductor structure of FIG. 6 after forming another sacrificial gate structure 14' in the gate cavity 26 in accordance with yet another embodiment of the present application. The another sacrificial gate structure 14' may include another optional sacrificial dielectric material portion 16', another sacrificial gate material portion 18' and another optional sacrificial dielectric cap portion 20'. The another optional sacrificial dielectric material portion 16', the another sacrificial gate material portion 18' and the another optional sacrificial dielectric cap portion 20' can be include materials as described above for optional sacrificial dielectric material portion 16, sacrificial gate material portion 18 and optional sacrificial dielectric cap portion 20. In this embodiment, the another sacrificial gate structure 14' is formed by deposition of the various materials into the gate cavity 26 after the silicon germanium alloy channel portion 12b is formed.

Figure 12:
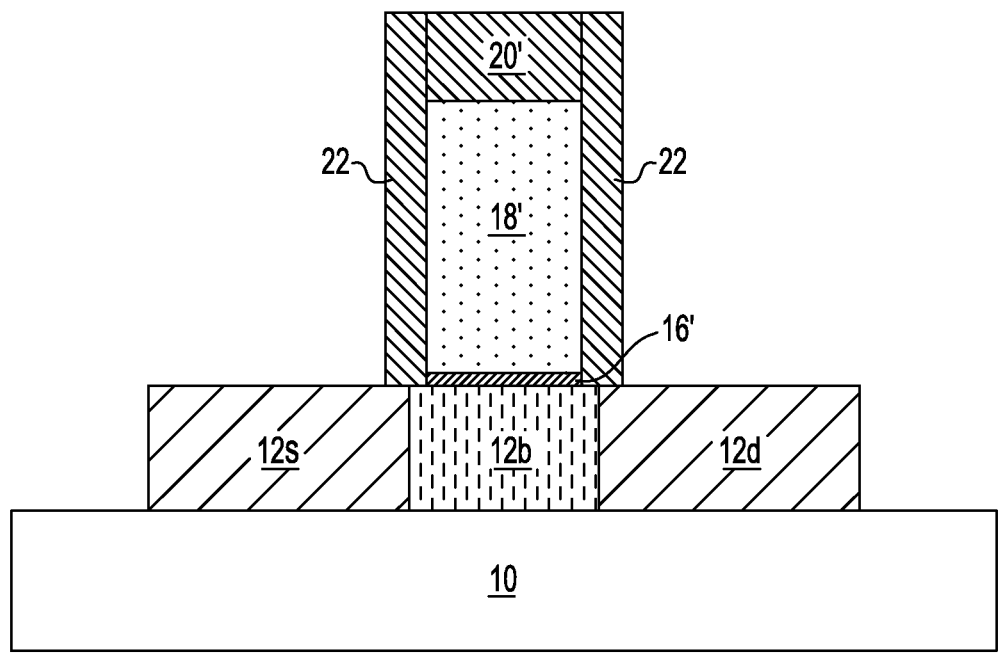
FIG. 12 is a cross sectional view of the exemplary semiconductor structure of FIG. 11 after removing the dielectric material.

Referring now to FIG. 12, there is illustrated the exemplary semiconductor structure of FIG. 11 after removing the dielectric material 24. Dielectric material 24 can be removed as described above in providing the structure shown in FIG. 8 of the present application.

Figure 13:
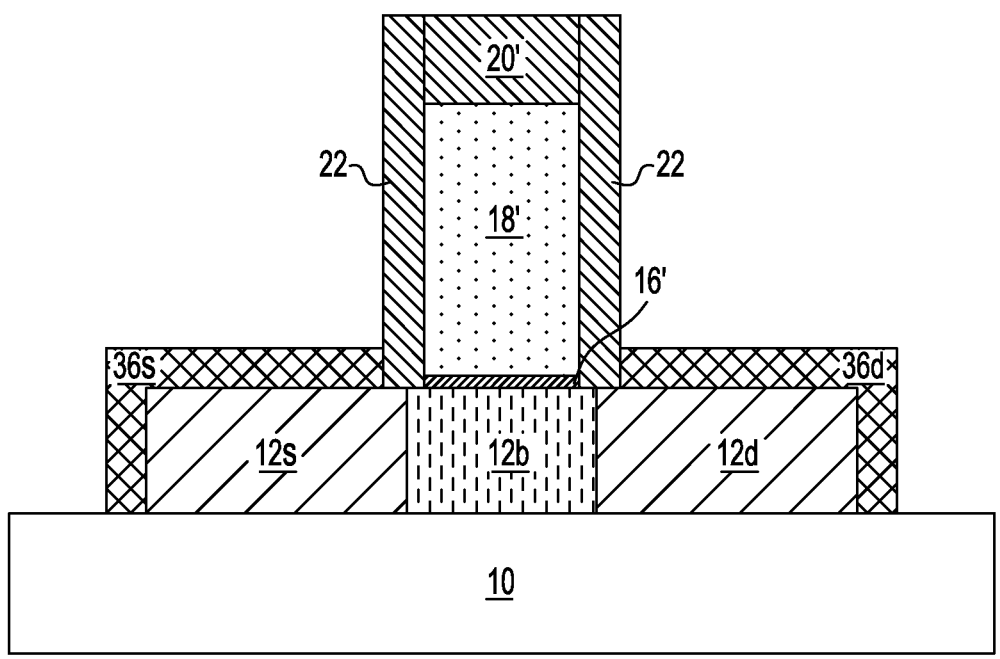
FIG. 13 is a cross sectional view of the exemplary semiconductor structure of FIG. 9 after forming a raised source region and a raised drain region on exposed silicon fin portions that are located laterally between the silicon germanium alloy channel portion.

Referring now to FIG. 13, there is illustrated the exemplary semiconductor structure of FIG. 12 after forming a raised source region 36s and a raised drain region 36d on exposed silicon fin portions (i.e., silicon fin source portion 12s and silicon fin drain portion 12d) that are located laterally between the silicon germanium alloy channel portion 12b. The raised source region 36s and the raised drain region 36d of this embodiment can be formed and include materials and dopants as described above in forming the raised source region 36s and the raised drain region 36d in providing the structure shown in FIG. 8 of the present application.

Following formation of the raised source region 36s and the raised drain region 36d, another dielectric material (not shown) like dielectric material 24 can be formed, and thereafter the another sacrificial gate structure 14' can be removed and replaced with a functional gate structure 30. In this embodiment, the functional gate structure shown in FIG. 7 or the functional gate structure shown in FIG. 10 can be formed. In this embodiment, the another dielectric material can remain in the structure or it can be removed. When removed the structure shown in FIG. 8 or FIG. 11 is provided. When the another dielectric material is present, a topmost surface of the another dielectric material would be coplanar with a topmost surface of the functional gate structure and the raised source region 36s and the raised drain region 36d would be completely covered with the another dielectric material.

In any of the various embodiments of the present application, the raised source region 36s and the raised drain regions 36d may be converted, in least in part, to a metal semiconductor alloy. In such an embodiment, the metal semiconductor alloy can be formed by forming a metal semiconductor alloy forming metal such as, for example, nickel, cobalt, platinum and/or palladium, on the raised source region 36s and the raised drain region 36d and then performing a metal semiconductor alloy forming anneal.

In any of the various embodiments of the present application, an interlevel dielectric material can be formed and thereafter one or more metal contacts can be formed within the interlevel dielectric material and contacting a portion of the raised source region 36s and the raised drain region 36d.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed as new is:

1. A semiconductor structure comprising:
a semiconductor fin comprising a channel region composed entirely of a silicon germanium alloy and positioned laterally between, and in direct physical contact with, an innermost sidewall of a silicon fin source portion and an innermost sidewall of a silicon fin drain portion, wherein said channel region has a topmost surface that is coplanar with a top most surface of both said silicon fin source portion and said silicon fin drain portion, and said silicon fin source portion and said silicon fin drain portion are both composed entirely of silicon;
a functional gate structure straddling said semiconductor fin and located directly above said channel region, wherein said functional gate structure comprises a gate dielectric portion and a gate conductor portion, and said gate dielectric portion is U-shaped and has topmost surfaces that are coplanar with a topmost surface of said gate conductor portion and said gate conductor portion has sidewall surfaces that directly contact a vertical portion of said U-shaped gate dielectric portion; and
a raised source region in direct contact with a topmost and an outermost sidewall of said silicon fin source portion, said outermost sidewall of said silicon fin source portion is opposite said innermost sidewall of said silicon fin source portion, and a raised drain region located in direct contact with a topmost surface and an outermost sidewall of said silicon fin drain portion, said outermost sidewall of said silicon fin drain portion is opposite said innermost sidewall of said silicon fin drain portion, wherein said raised source region has an epitaxial relationship with said silicon fin source portion and wherein said raised drain region has an epitaxial relationship with said silicon drain portion.

2. The semiconductor structure of claim 1, wherein said raised source region and said raised drain region comprise silicon.

3. The semiconductor structure of claim 1, wherein said raised source region and said raised drain region comprise a semiconductor material other than silicon.

4. The semiconductor structure of claim 1, wherein said silicon germanium alloy of said channel region has a bottommost surface that is coplanar with a bottommost surface of both of said silicon fin source portion and said silicon fin drain portion.

5. The semiconductor structure of claim 1, wherein said raised source region and said raised drain region are spaced apart from said functional gate structure by a lower portion of a dielectric spacer.

6. The semiconductor structure of claim 1, further comprising a gate cap located on said topmost surfaces of said gate dielectric portion and said gate conductor portion.

7. The semiconductor structure of claim 1, further comprising a substrate located directly beneath the semiconductor fin and said substrate includes an insulator.

8. The semiconductor structure of claim 1, further comprising a substrate located directly beneath the semiconductor fin and said substrate comprises silicon.

9. The semiconductor structure of claim 1, further comprising a dielectric spacer located on sidewalls of said functional gate structure, and wherein said topmost surfaces of both said gate dielectric portion and said gate conductor portion are coplanar with a topmost surface of said dielectric spacer.

10. The semiconductor structure of claim 6, further comprising a dielectric spacer located on sidewalls of said functional gate structure, and wherein said topmost surfaces of both said gate dielectric portion and said gate conductor portion are coplanar with a topmost surface of said dielectric spacer.

* * * * *